United States Patent
Buschner et al.

(10) Patent No.: US 6,444,581 B1
(45) Date of Patent: Sep. 3, 2002

(54) AB ETCH ENDPOINT BY ABFILL COMPENSATION

(75) Inventors: Paul C. Buschner, Colchester; Timothy G. Dunham, So. Burlington; Howard S. Landis, Underhill, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/354,251

(22) Filed: Jul. 15, 1999

(51) Int. Cl.[7] .............................................. H01L 21/302
(52) U.S. Cl. ...................... 438/689; 438/690; 438/704; 438/706; 438/745
(58) Field of Search ................................. 438/689, 690, 438/8, 7, 706, 704, 745

(56) References Cited

U.S. PATENT DOCUMENTS

| | | | |
|---|---|---|---|
| 4,240,687 A | * 12/1980 | Bunnell et al. ................ 339/99 |
| 4,878,099 A | * 10/1989 | Nilarp ........................ 357/71 |
| 5,070,602 A | * 12/1991 | Kaufman ..................... 29/827 |
| 5,234,868 A | 8/1993 | Cote | |
| 5,264,387 A | 11/1993 | Beyer et al. | |
| 5,265,378 A | * 11/1993 | Rostoker .................. 51/165.75 |
| 5,358,604 A | * 10/1994 | Lin et al. ..................... 156/664 |
| 5,372,673 A | * 12/1994 | Stager ........................ 156/626 |
| 5,629,242 A | 5/1997 | Nagashima et al. | |
| 5,648,670 A | * 7/1997 | Blanchard .................... 257/329 |
| 5,705,435 A | 1/1998 | Chen | |
| 5,721,172 A | 2/1998 | Jang et al. | |
| 5,756,386 A | * 5/1998 | Blanchard .................... 438/270 |
| 5,804,084 A | 9/1998 | Nasby et al. | |
| 5,817,567 A | 10/1998 | Jang et al. | |

OTHER PUBLICATIONS

P. 15 showing a portion of a 1986 technical article describing how the depth of conformally deposited material has different thickness over different density of topography.

* cited by examiner

Primary Examiner—Benjamin L. Utech
Assistant Examiner—Vanessa Perez-Ramos
(74) Attorney, Agent, or Firm—Scully, Scott, Murphy & Presser; Anthony Canale

(57) ABSTRACT

A method for determining the AB etch endpoint during an silicon trench isolation fabrication process requires the introduction into the STI design a sufficient quantity of "dummy" diffusion structures that provide a strong endpoint signal during normal STI fabrication and, that which endpoint signal may be controlled by adjustment of the planarization shapes associated with the dummy diffusion structures.

10 Claims, 10 Drawing Sheets

AB ETCH ENDPOINT BY ABFILL COMPENSATION

BACKGROUND OF THE INVENTION

1. Field of the Invention

The present invention is directed to the fabrication of semiconductor integrated circuits, and, particularly, to a method and apparatus for controlling an etch process endpoint employed during a shallow trench isolation planarization process by adjusting planarization shapes associated with dummy diffusion structures provided in the semiconductor IC.

2. Discussion of the Prior Art

As described herein, "diffusion shapes" in a Shallow Trench Isolation (STI) manufacturing process is referred to as RX, and "planarization shapes" is referred to as AB.

As known in the industry, the basic steps in a STI manufacturing process include the following: 1) RX photo -which includes a patterning step to define the shallow trench regions to be formed. Par-ticularly, as shown in FIG. 1(a), an RX photoresist layer 11 is patterned over a silicon substrate 10 covered by pad nitride films 19, to define the areas where trenches are to be formed; 2) RX etch—which includes etching the shallow trench regions. Particularly, as shown in FIG. 1(b), an etching process enables formation of isolation trenches 15 and large isolation trench area 15a, which, as shown, isolate active semiconductor regions 18. As shown in FIG. 1(b), a thin nitride pad layer 19 remains on top of active device active areas 18; 3) oxide deposition for filling the trench regions (e.g., using tetraethoxysilane "TEOS"). As shown in FIG. 1(c) oxide deposition layer 20 conforms to the surface topography; 4) AB photo—which includes a patterning step defining areas that are to receive AB photoresist 23, such as shown in FIG. 1(d); 5) Anneal/ AB planar resist apply/Anneal—which requires deposition of a planar resist film 25 above the AB photoresist layer 23 which has been subject to reflow anneal process as shown in FIG. 1(e); 6) AB etch 1 (photoresist) to obtain planarity for oxide layer above the trench region as shown in FIG. 1(f). It is understood that during this etch process, exposed areas of oxide enable measurable changes in gas chemistry, enabling an "emission endpoint detection"; 7) AB etch 2 (oxide) for removing the oxide above the oxide layer down to the nitride layer 19 formed on top active areas 18 such as shown in FIG. 1(g); 8) Oxide chem-mech polish ("CMP") which, as shown in FIG. 1(h), planarizes the device surface by removing all of the oxide layer from on top of the pad nitride layers of active regions 18; and, finally 9) a pad nitride strip which results in the completed structure comprising active areas 18 and oxide-filled isolation trenches 15 such as illustrated in FIG. 1(i).

The correct endpoint for the AB etch step (Step 7) is usually determined either by analysis of individual-wafer measurements of trench depth, oxide thickness and AB etch rate; or, by nitride emission endpoint detection. The former method is robust but measurement intensive, as variations in trench depth, TEOS thickness and AB etch time, and each of these contributions must be accounted for on a wafer-by-wafer basis.

FIG. 2 is a plot 10 depicting a typical nitride emission endpoint trace versus etch time. As shown in FIG. 2, the nitride endpoint emission signal 12 is weak and relatively flat until a point 14 is reached where the signal rapidly increases in strength indicating nearness to an etch-point limit, i.e., where the underlying nitride becomes exposed. Afterwards, the signal reaches levels off at 16 indicating the endpoint of the etch process. The latter nitride emission endpoint detection method is efficient but not robust, as some diffusion structures must be exposed in order to elicit a nitride emission endpoint signal. These diffusion structures are susceptible to AB etch and (reactive ion etch) RIE-through and to overpolish, both of which can result in defective or unreliable transfer devices.

Thus, the most difficult part of standard Shallow Trench Isolation processing is determining the correct time to stop the oxide etch. An exemplary STI etch process typically comprises a good cross-wafer uniformity for all processes; strong, repeatable emission endpoints for dry etch processes, and a uniform thickness of oxide remaining over all diffusions before chemical-mechanical ("chem-mech") polishing. But these three conditions are generally not mutually compatible. That is, if oxide is to remain over the pad nitride that covers diffusions, there can be no nitride emission endpoint signal from that nitride.

It would thus be highly desirable to provide a method and apparatus for circumventing the problem of determining the AB etch endpoint by introducing into the design a sufficient quantity of "dummy" diffusion structures that provide a strong endpoint signal.

SUMMARY OF THE INVENTION

It is an object of the invention to provide a technique for circumventing the problem of determining the AB etch endpoint by introducing into the STI design a sufficient quantity of "dummy" diffusion structures with "adjusted" planarization that are made to provide a strong endpoint signal during normal STI fabrication.

It is a further object of the invention to provide a method for determining the AB etch endpoint by introducing into the STI design a sufficient quantity of "dummy" diffusion structures that provide a strong endpoint signal during normal STI fabrication and, that which endpoint signal may be controlled by adjustment of the planarization shapes associated with the dummy diffusion structures.

According to the invention, the technique comprises a step 1) of placing closely-spaced arrays of small, self-similar "dummy" diffusion shapes in the available "whitespace" of a semiconductor design; then, a step 2) generating a set of "planarization shapes" that when rendered in photoresist effectively eliminates the topography associated with the "real" diffusion shapes in the design; then, a step 3) associating a "dummy planarization shape" with each dummy diffusion shape, the dummy planarization shape being constructed so that a certain amount of topography associated with an array of dummy diffusion shapes is retained when the dummy planarization shapes are rendered in photoresist along with the shapes defined in the second step; and, a step 4) proceeding with standard STI processing, with the following modifications: i) insuring that the nominal thickness by which the deposited oxide exceeds the etched trench depth is approximately that same as the retained topography from Step 3); and, ii) terminating the oxide-etch step based on a nitride emission endpoint signal arising from the dummy diffusion shapes.

BRIEF DESCRIPTION OF THE DRAWINGS

Further features, aspects and advantages of the apparatus and methods of the present invention will become better understood with regard to the following description, appended claims, and accompanying drawings where.

DETAILED DESCRIPTION OF THE DRAWINGS

As described herein, "diffusion shapes" in an STI manufacturing process is referred to as RX, "planarization shapes" is referred to as AB, "dummy RX diffusion shapes" is referred to as RXFILL, and "dummy planarization shapes" is referred to as ABFILL.

Figure 5:
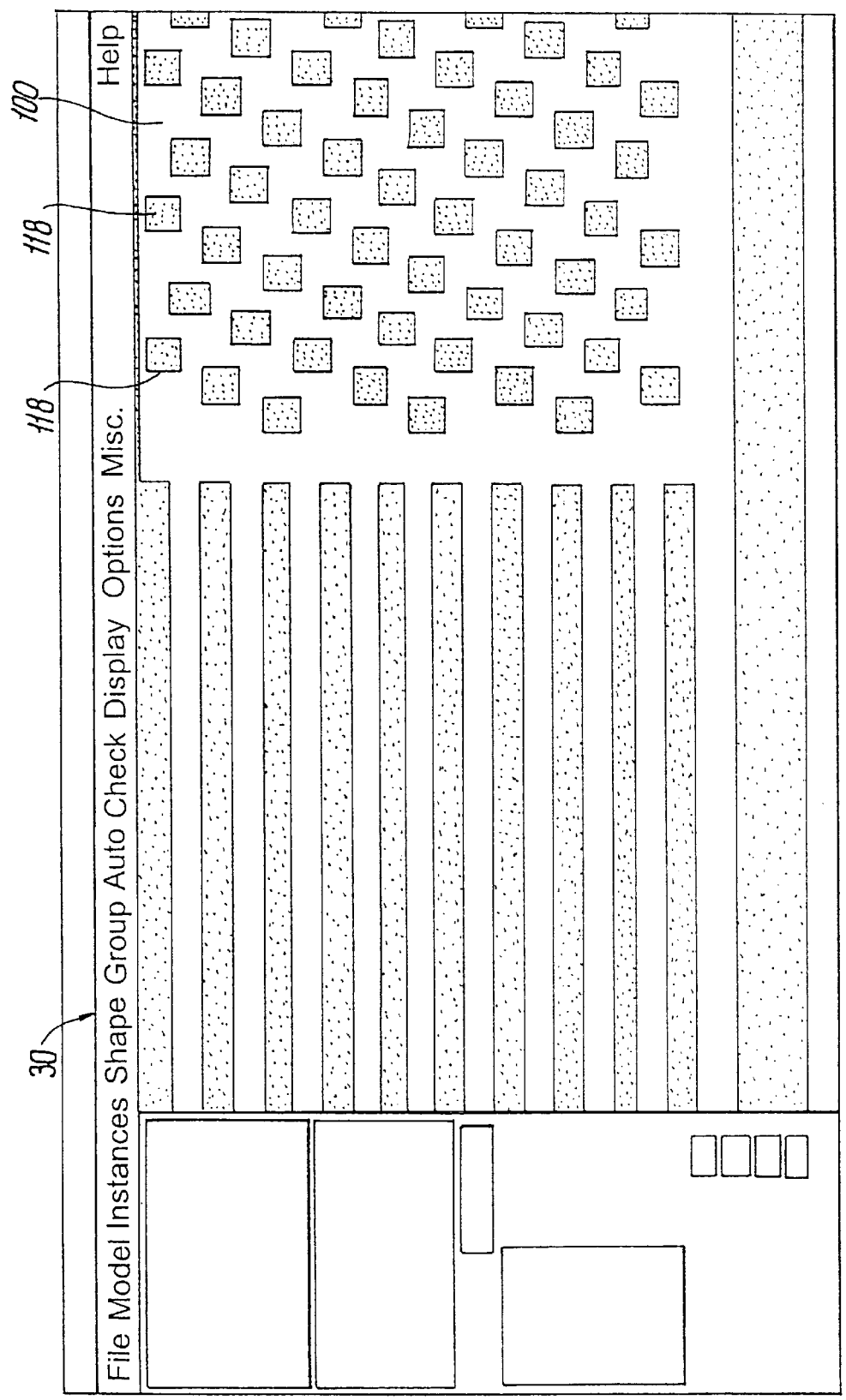
FIG. 5 illustrates a computer screen display depicting location of dummy diffusion RXFILL shapes fabricated in a non-used portion of the semiconductor substrate.

FIG. 5 illustrates a computer screen display 30 depicting location of dummy diffusion RXFILL shapes 35 manufactured in an unused portion of the semiconductor substrate, e.g., whitespace area 100, outside of active circuit regions according to the invention. As depicted in FIG. 5 and described in greater detail herein, the dummy RX diffusion shapes are near uniform in size with size, shape, orientation and density of the fill shapes designed and adjusted according to the real RX structures of the active circuits to be manufactured. That is, based on the RX structures of the active circuits to be manufactured, the dummy RXFILL shapes are chosen so as to produce a strong (nitride emission) endpoint signal when performing an AB etch.

FIGS. 3(a)–3(i) illustrate the same wafer and STI manufacturing process depicted in FIGS. 1(a)–1(i), however, simultaneously utilizing dummy active area and dummy planarization shapes of the invention as it progresses through the conventional STI manufacturing process.

Figure 1A:
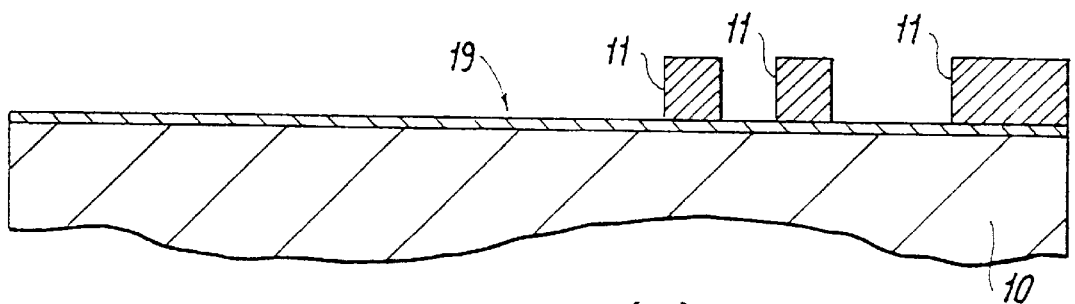
FIGS. 1(a)–1(i) depict various process steps of a conventional STI fabrication technique.
Figure 1B:
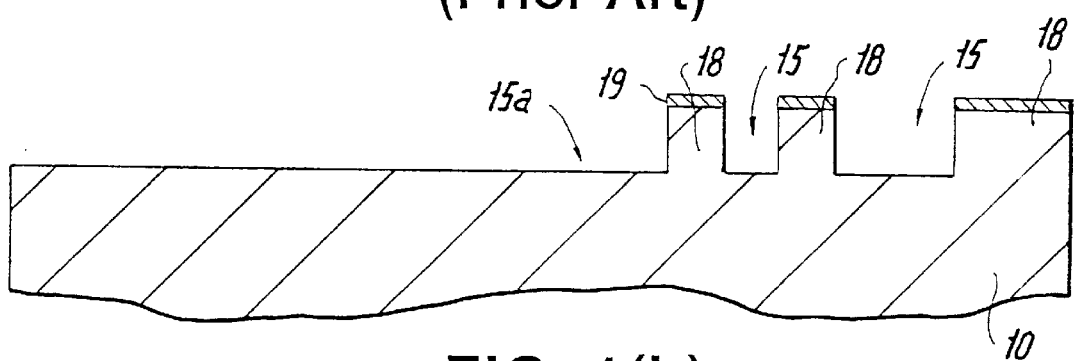
Figure 1C:
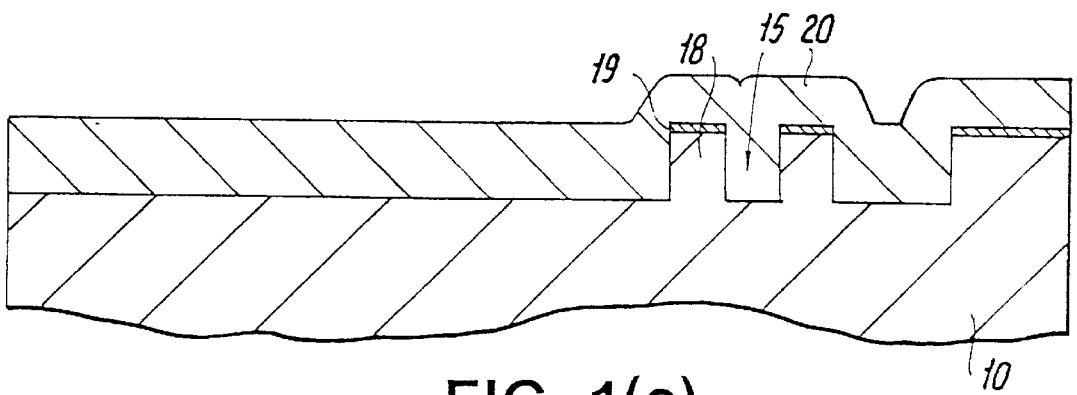
Figure 1D:
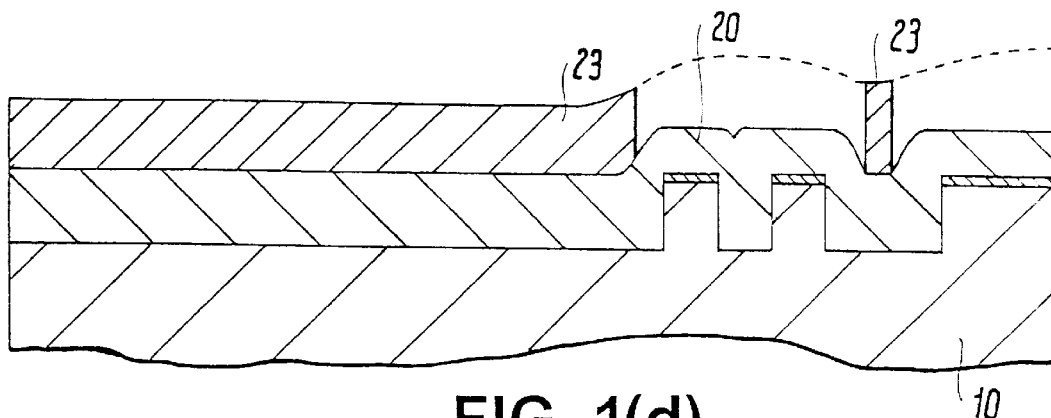
Figure 1E:
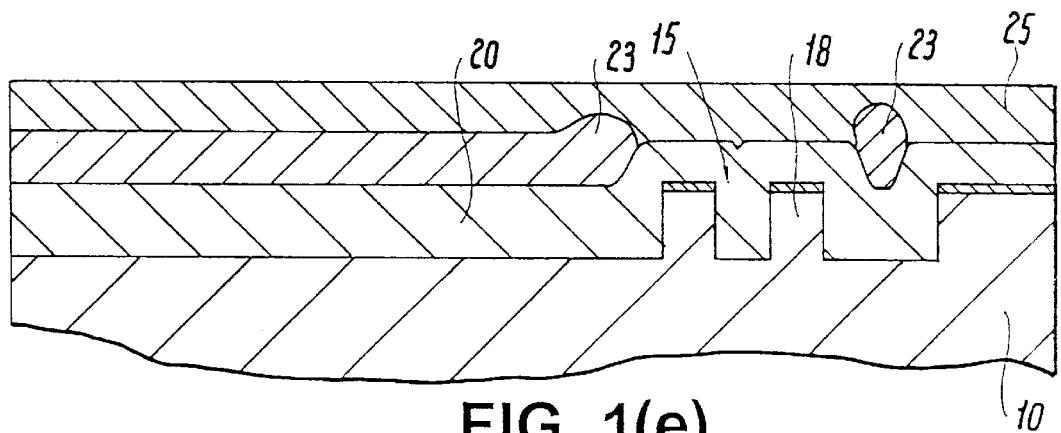
Figure 1F:
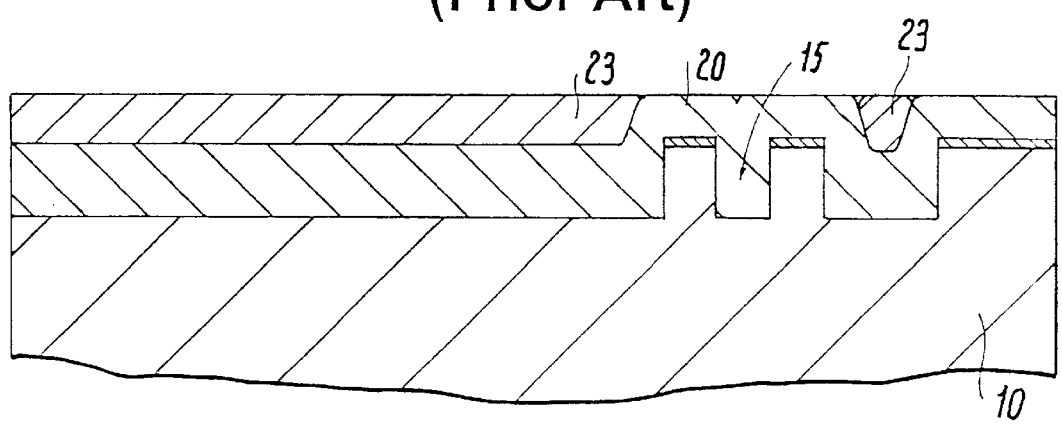
Figure 1G:
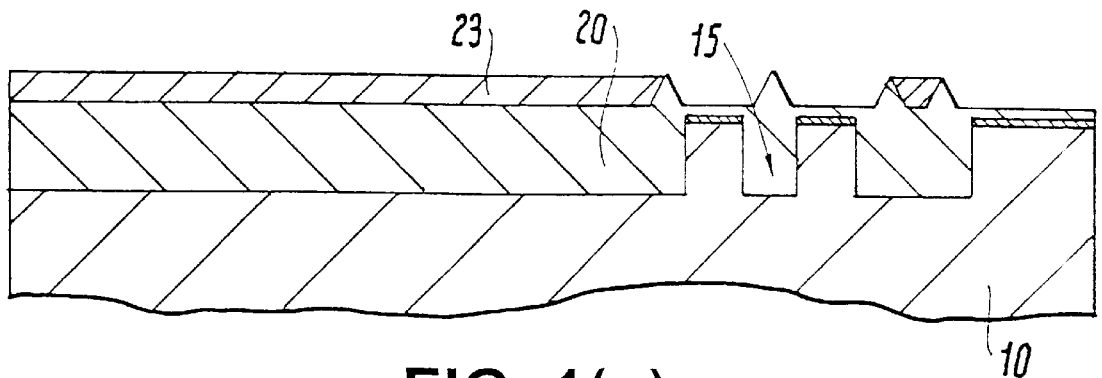
Figure 1H:
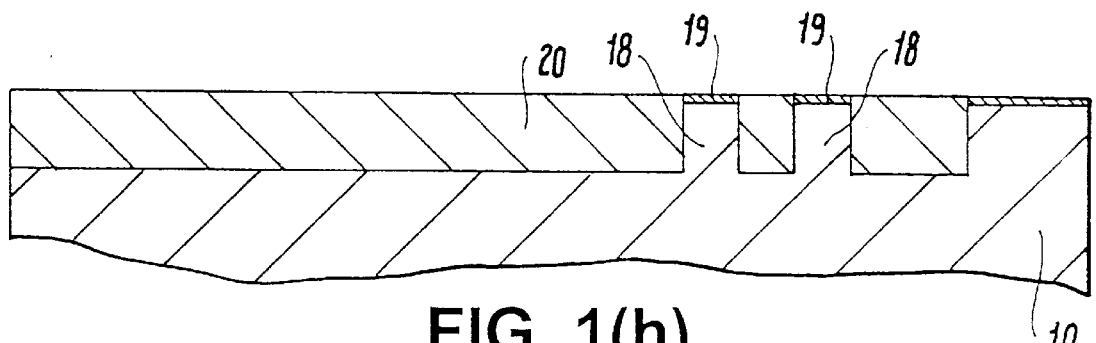
Figure 1I:
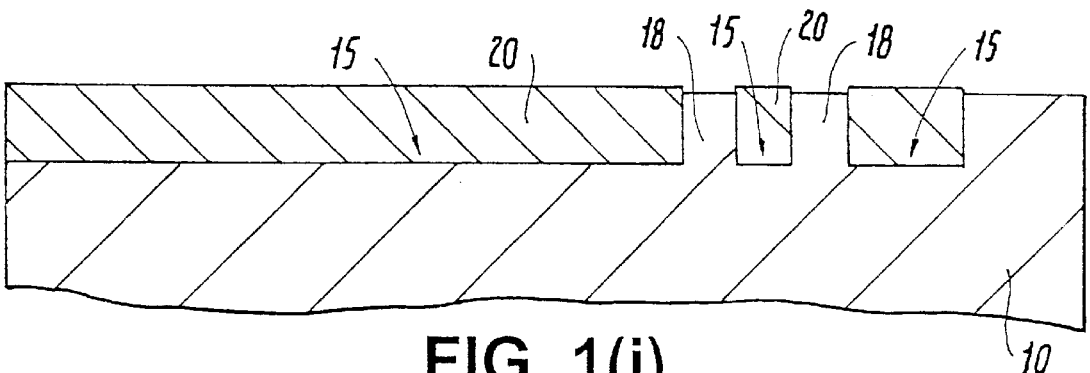
Figure 3A:
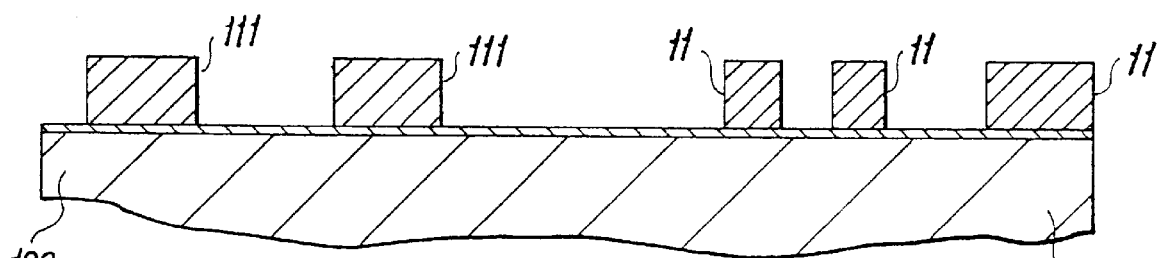
FIGS. 3(a)–3(i) illustrate the same wafer as illustrated in the STI manufacturing process depicted in FIGS. 1(a)–1(i), however, utilizing dummy active area and dummy planarization shapes of the invention as it progresses through the conventional STI manufacturing process.
Figure 3B:
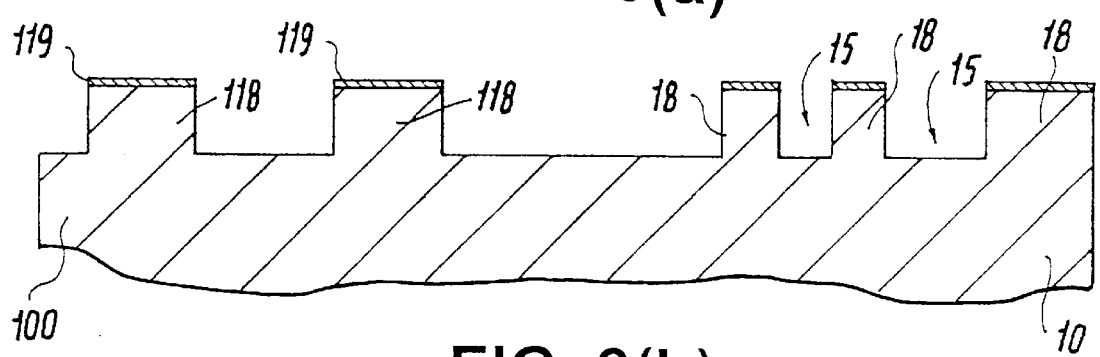
Figure 3C:
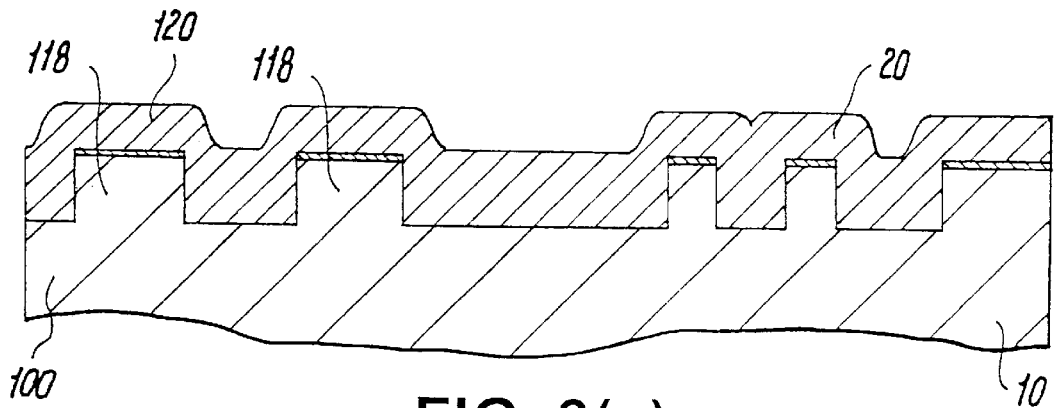
Figure 3D:
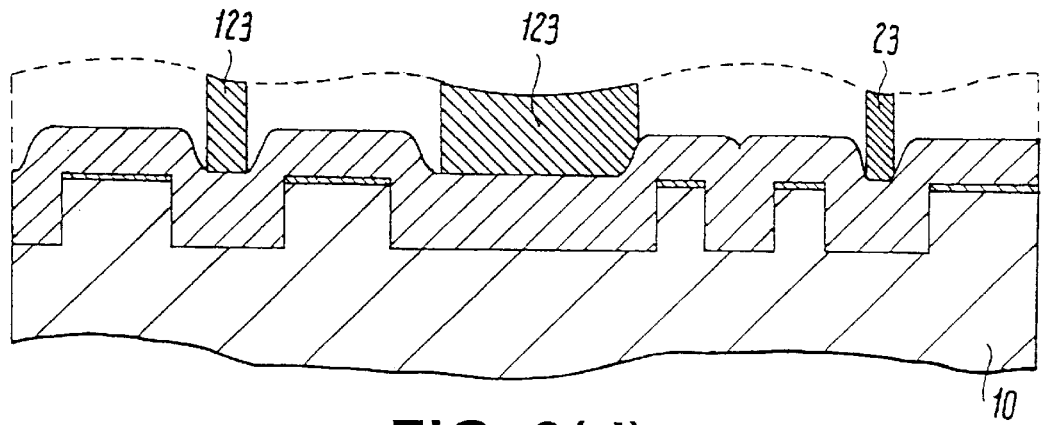
Figure 3E:
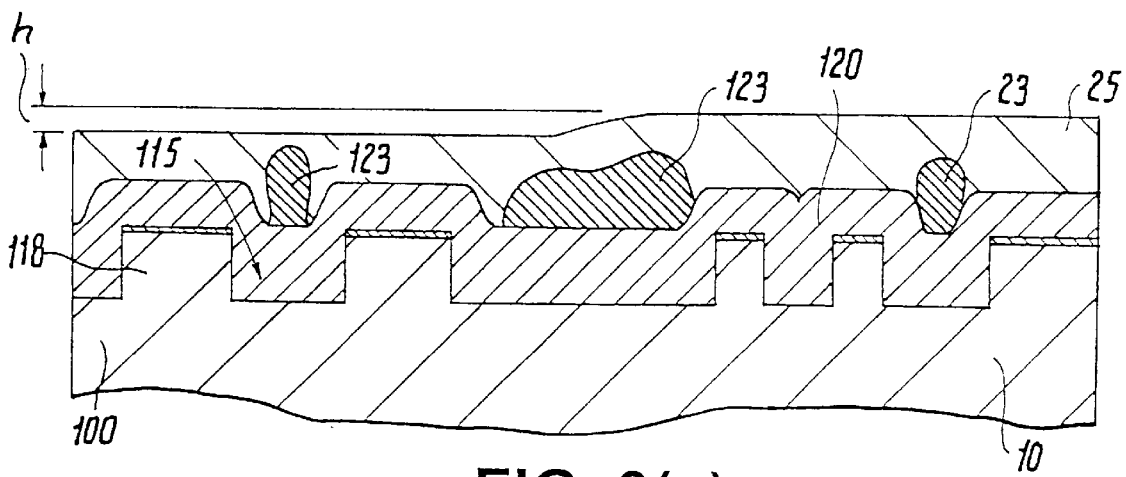
Figure 3F:
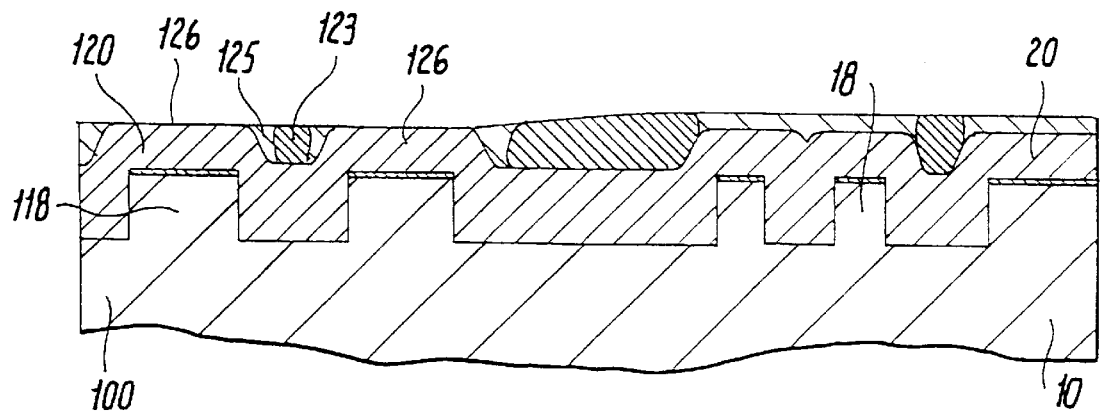
Figure 3G:
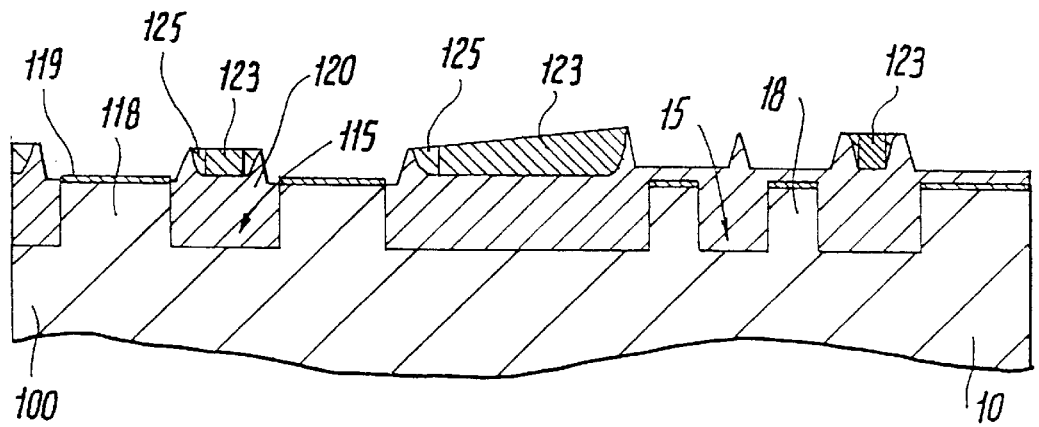
Figure 3H:
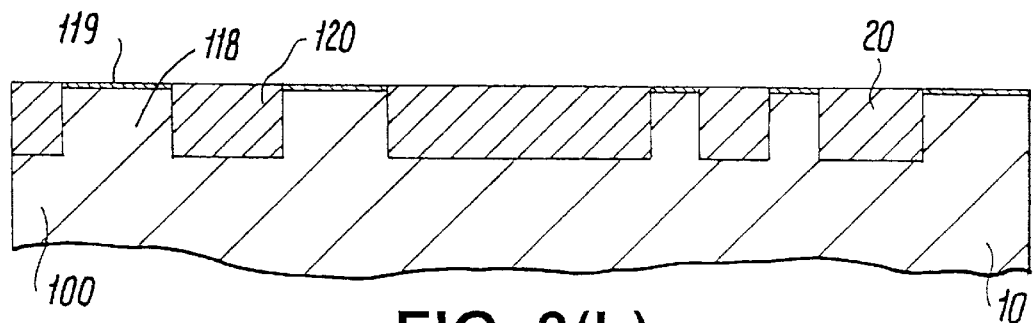
Figure 3I:
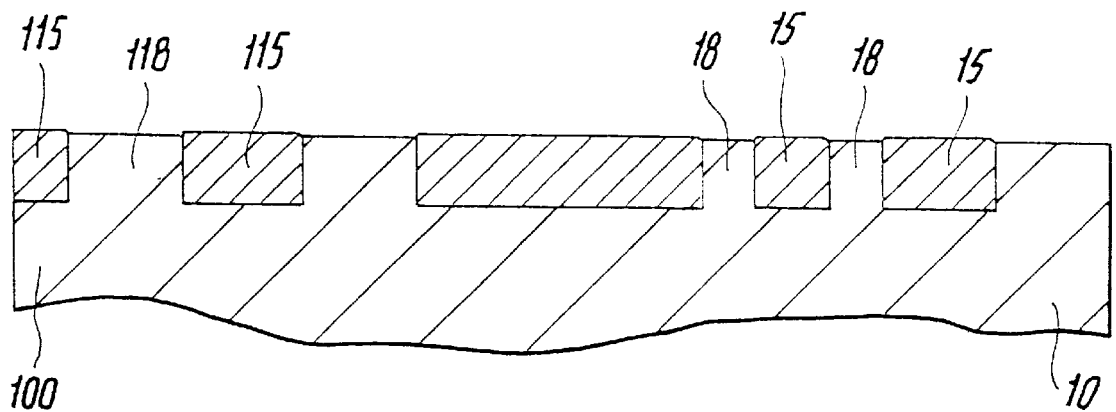

Particularly, as shown in FIG. 3(a), the steps in a STI manufacturing process according to the invention include the following: 1) RX photo -which includes a patterning step to define the shallow trench regions to be formed. Particularly, as in the prior art (FIG. 1(a)), an RX photoresist layer 11 is patterned over a silicon substrate 10 which contains pad nitride films 19 to define the areas where trenches are to be formed. According to the invention, however, an RX photoresist layer 111 is additionally patterned over an unused "dummy" portion of the substrate whitespace region 100 of substrate 10; 2) RX etch—for forming shallow trench regions 15 to isolate active device regions 18, as depicted in FIG. 1(b), and, according to the invention as shown in FIG. 3(b), etching to form additional dummy RXFILL structures 118. Particularly, etching enables the formation of isolation trenches 115 isolating dummy RXFILL shapes 118. As shown in FIG. 3(b), a thin nitride pad layer 119 remains on top of RXFILL areas 118; 3) Oxide deposition for filling the trench regions 15 and 115. As shown in FIG. 3(c), oxide deposition layer 120 conforms to the surface topography of the RX and RXFILL structures; 4) AB photo—which includes a patterning step defining areas that are to receive AB photoresist 123, such as shown in FIG. 3(d). According to the invention, as shown in FIG. 3(d) and further explained below with reference to FIGS. 6(a)–6(c), regions 123 of AB photoresist formed over the oxide layer 120 of the RXFILL region are intentionally adjusted to be "too small" to completely planarize the region 100 containing the dummy RXFILL shapes; 5) Anneal/AB planar resist apply/Anneal which requires deposition of a planar resist film 125 above the AB photoresist layer 123 which has been subject to reflow anneal process as shown in FIG. 3(e). In the preferred embodiment, the thickness of the layer of planar resist film 125 formed atop AB resist layer at the dummy RXFILL region 100 is a function of the size of the sections of AB photoresist in the dummy region 100. Thus, for example, as shown in FIG. 3(e), the height "h" represents the offset between the normal regions of active areas and the region 100 containing only RXFILL shapes; 6) AB etch 1 (photoresist) to obtain planarity for oxide layer above the trench regions as shown in FIG. 3(f). However, according to the invention, due to the offset height "h", the oxide 126 over the RXFILL shapes 18 are exposed first, i.e., before any exposure of oxide at the active regions 18, as shown in FIG. 3(f); 7) AB etch 2 (oxide) for removing the oxide above the oxide layer down to the nitride layers formed on top of the active and dummy RX shapes such as shown in FIG. 3(g). However, according to the preferred embodiment of the invention, due to the initial offset height "h" (FIG. 3(e), regions of pad nitride are exposed in dummy RXFILL region 100 before pad nitride is exposed in "real" active area. Thus, a strong emission signal is achieved without exposing pad nitride in the "real" active areas. The head-start, i.e., offset height "h", may be adjusted to be a convenient value; 8) Oxide chem-mech polish ("CMP") which, as shown in FIG. 3(h), planarizes the device surface by removing all of the oxide layer from on top of the pad nitride layers of the dummy RXFILL regions and RX active regions. It is understood that any slight damage to the RXFILL shapes 118 is acceptable since they are inert structures; and, finally 9) a pad nitride strip which results in the completed structure comprising active areas 18, RXFILL areas 118, and oxide-filled isolation trenches 15 and 115, such as illustrated in FIG. 3(i).

Figure 2:
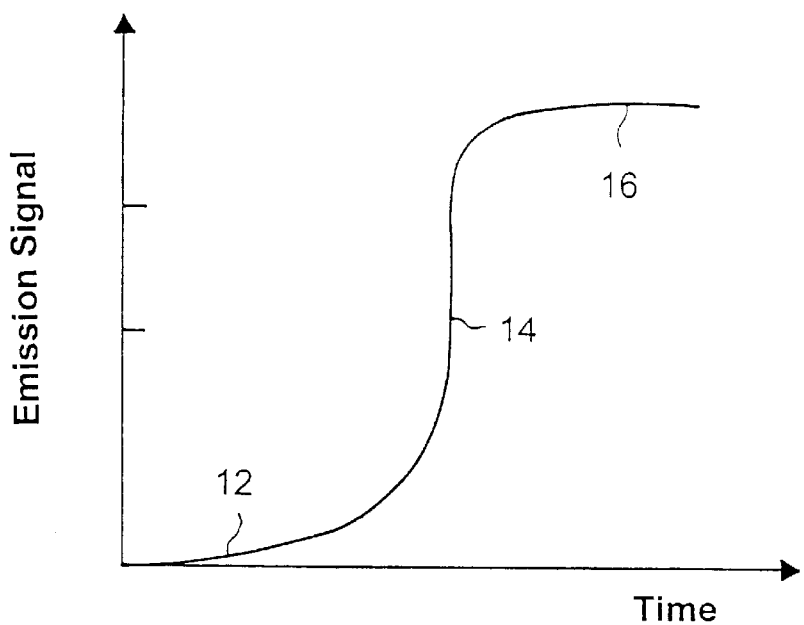
FIG. 2 is a plot depicting a typical nitride emission endpoint trace during AB etch step depicted in FIG. 1(g)
Figure 4:
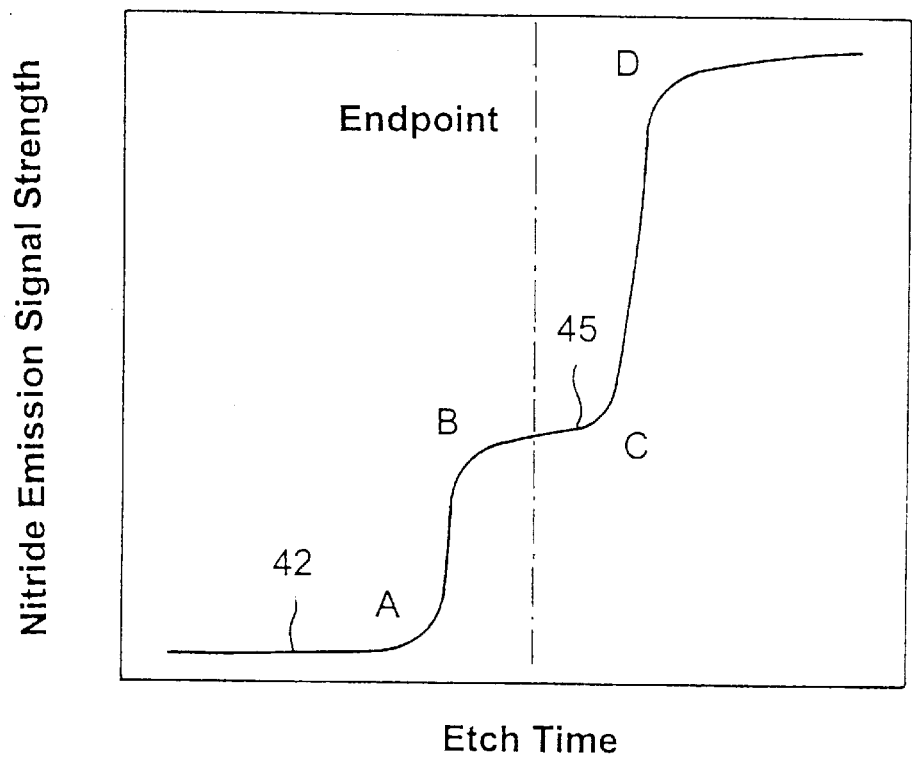
FIG. 4 is a plot depicting a typical nitride emission endpoint trace during AB etch step depicted in FIG. 4(g).

Preferably, the dummy RXFILL shapes are chosen so as to make it possible to provide a strong nitride emission endpoint signal from RXFILL that arises while all RX shapes are still covered by a convenient thickness of oxide. FIG. 4 illustrates a plot of nitride emission signal strength versus etch time for the dummy RXFILL shapes provided in the dummy region 100 according to the invention. As shown in FIG. 4, no nitride emission signal 42 is detectable until reaching an etch point time A when the RXFILL begins to clear, as described above with respect to FIG. 3(g). The appropriate endpoint is designed to be between etchpoint times indicated at the intermediate plateau 45 between points B and C, which define the region of saturation for emission from the RXFILL. The endpoint may be implemented before time indicated at point C or D, as the rise in nitride emission signal strength corresponds to the exposure of nitride covering "real" RX shapes. Generally speaking, the separation between points A and C corresponds to the "retained topography", which depends on the ABFILL "adjustment". The relative signal strength between points B and D is determined by the relative densities of RXFILL and RX. In the absence of RXFILL and ABFILL, as described with reference to FIG. 2, a nitride emission endpoint curve for AB etch (FIG. 1(g)) does not contain any intermediate plateaus.

Instead, the endpoint would need to be called based on the first indication of a rise in the signal strength from the baseline.

According to the preferred embodiments of the invention, dummy RXFILL shapes must follow certain prescriptions in order to produce the desired endpoint signal without adversely affecting behavior of any real circuitry on the chip. These prescriptions include the following:

1. The RXFILL must be set back from RX, gate conductor, and contact or local interconnect shapes and from N-well boundaries;
2. ABFILL must be tailored in such a way that Oxide clears from RXFILL before Oxide clears from RX;
3. The local density of RXFILL must be great enough to largely withstand Oxide CMP step; and
4. The total density of RXFILL must be great enough to elicit a robust endpoint signal.

RXFILL, when coupled with ABFILL as described herein according to the invention, satisfies the above-enumerated prescriptions.

It should be understood that the RXFILL local density is normally designed to be about 40%, which allows regions of RXFILL to act as robust polish stops, even if ABFILL tailoring has allowed the RXFILL to be cleared of overlying oxide well in advance of the "real" RX structures. Since RXFILL is never used as part of a transistor, even if the transfer dielectric is degraded by occasional RIE-through or overpolish, there is no electrical risk to the design. Note that the total density of RXFILL added to a chip is typically about 10–20%, much more than the 1—3% typically needed for a strong nitride emission endpoint.

Figure 6A:
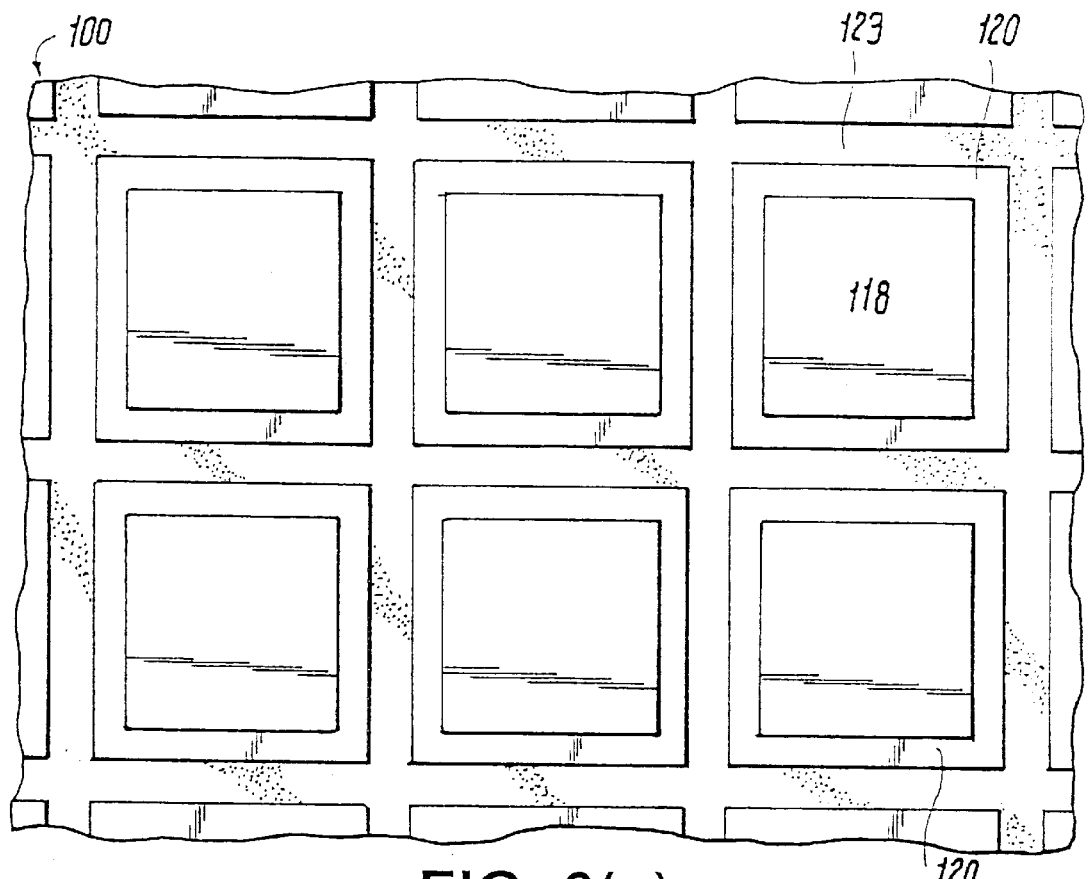
FIGS. 6(a)–6(c) illustrates various top down views of typical dummy RXFILL shapes and the corresponding pattern of a AB (planarization) shapes according to the invention.
Figure 6B:
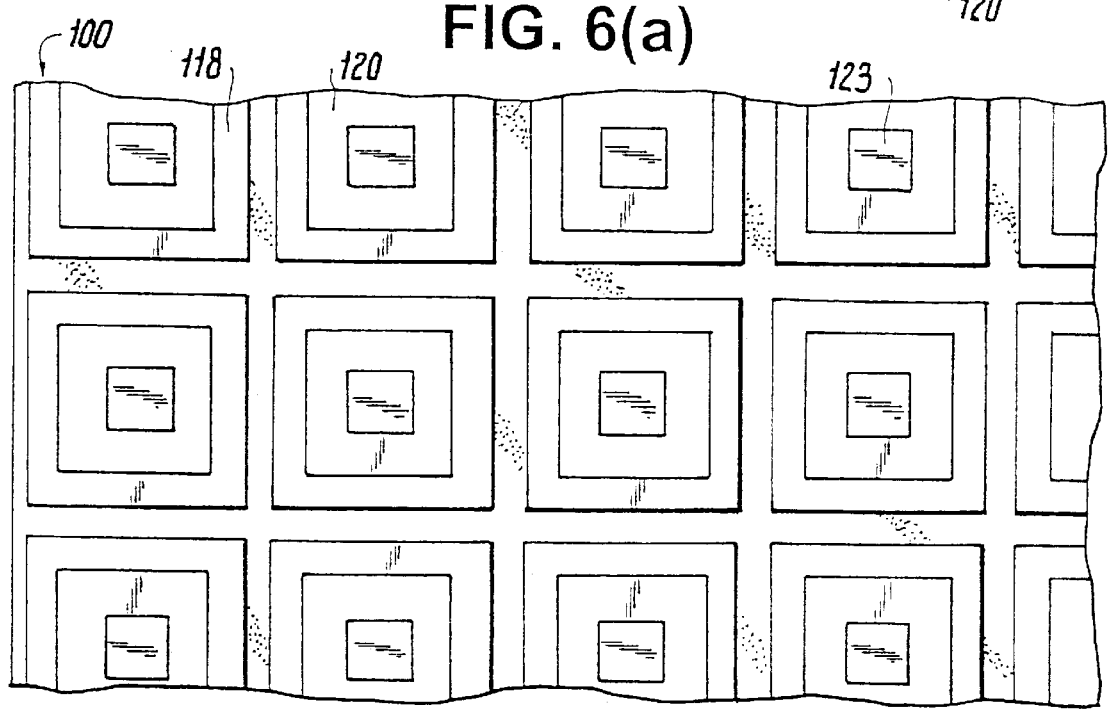
Figure 6C:
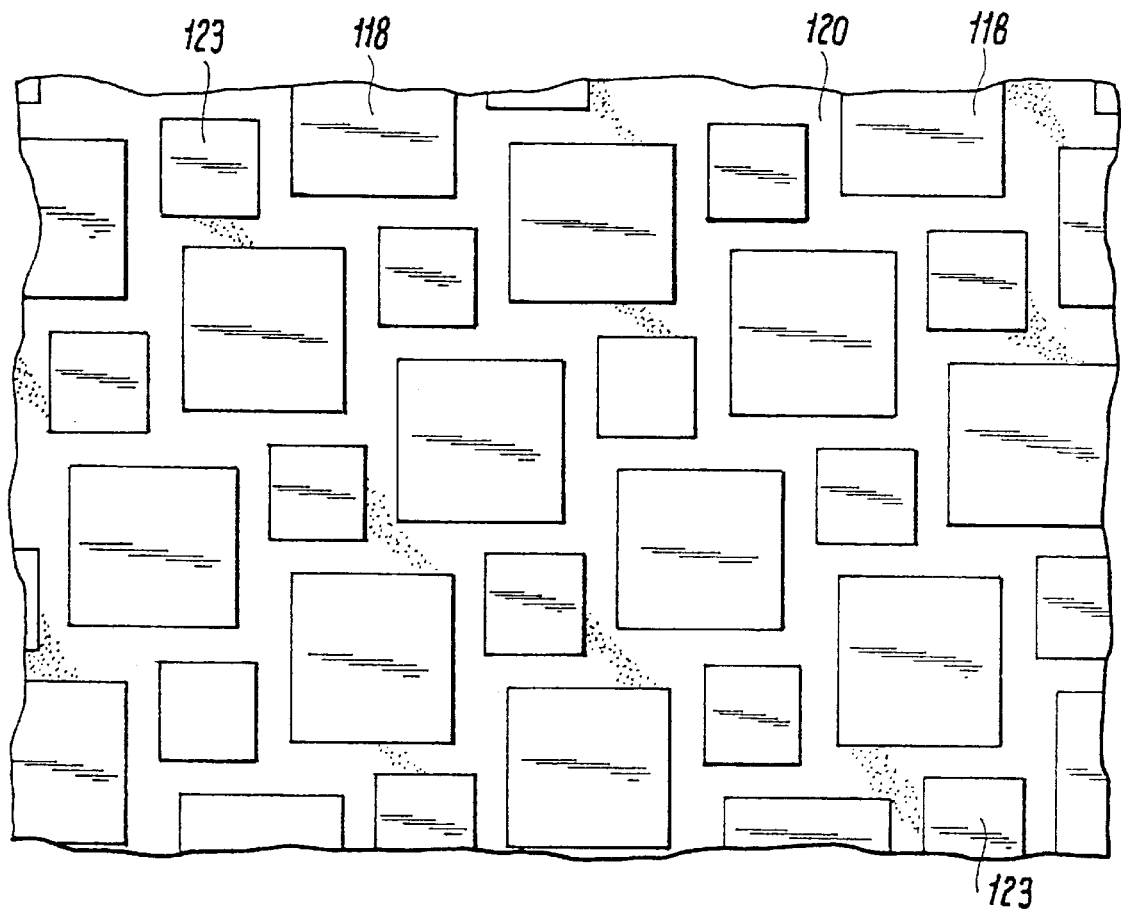

FIGS. 6(a)–6(c) illustrates various top down views of typical dummy RXFILL shapes and the corresponding pattern of a AB (planarization) shapes according to the invention. For instance, according to a first embodiment as shown in FIG. 6(a), in dummy substrate region 100, dummy ABFILL planarization structures 123 are shown fabricated a top oxide layer 120 in between dummy RXFILL structures 118 as shown and described with respect to FIG. 3(d). FIG. 6(b) illustrates a top down view of dummy RXFILL shapes 118 and a corresponding pattern of polygonal AB (planarization) shapes 123 according to a second embodiment of the invention and, FIG. 6(c) illustrates a top down view of dummy RXFILL shapes 118 and the corresponding pattern of a AB (planarization) shapes 123 according to a third embodiment of the invention. Replacing the rectangular base ABFILL shape with a polygon as in the embodiments of FIGS. 6(b) and 6(c) may provide more latitude in setting the amount of retained topography.

It is understood that the planarization shapes 123 depicted according to the three embodiments illustrated in FIGS. 6(a)–6(c) may be incrementally made larger or smaller, enabling the offset height "h" (FIG. 3(e) to be smoothly adjusted as might be required for a specific set of manufacturing dimensions and tolerances.

Using this invention, individual-wafer-tailoring is not needed at AB etch or Oxide CMP. All of the wafer-to-wafer and lot-to-lot variability in the RX etch depth, the TEOS deposition thickness, the AB etch rate, and to a slightly lesser degree RX and AB image control, are accommodated by the RXFILL endpoint signal. This is because the dummy RXFILL shapes is subject to essentially the same processing as RX shapes, except for the prescribed amount of retained topography. Since the retained topography is essentially independent of the aforementioned wafer-to-wafer and lot-to-lot tolerances, the RXFILL endpoint will come at the correct time, independent of these tolerances. Similarly, individual-wafer-tailoring is not needed at STI CMP, since the RXFILL endpoint insures that a uniform, repeatable amount of oxide will remain over all real diffusions, independent of wafer-to-wafer and lot-to-lot variations.

While the invention has been particularly shown and described with respect to illustrative and preformed embodiments thereof, it will be understood by those skilled in the art that the foregoing and other changes in form and detail may be made therein without departing from the spirit and scope of the invention which should be limited only by the scope of the appended claims.

We claim:

1. A method of co-planarizing at least one material on the surface of a semiconductor substrate having a first region including trenches for isolating a plurality of diffusion shapes, said method comprising the steps of:

providing second region including trenches for isolating a plurality of dummy diffusion shapes on said surface, providing oxide deposition above said first and second regions;

applying a first coating of photoresist to said first and second regions above said oxide layer at a predetermined thickness, an amount of photoresist material being patterned and retained in said second region being insufficient to completely planarize said second region in a subsequent planarizing step;

applying a second coating of photoresist on top of said first layer of photoresist in said first and second regions, a thickness and leveling properties of said applied second layer of photoresist being sufficient to allow local planarization within said first and second regions, said applied second coating forming a substantially flat surface over said first region, and a substantially flat surface over said second region, with a height of said flat surface being lower in said second region than in said first region; and, etching said second photoresist, first photoresist, and those sections of said oxide layer not recessed within said trenches, to planarize the oxide within said first and second regions, wherein the second region having said dummy diffusion shapes is planarized prior to the first region by terminating said etching upon detection of an emission endpoint signal arising from the dummy diffusion structures during said etching.

2. A method for determining a surface etch endpoint during a planarization step of a silicon trench isolation (STI) fabrication process, said method comprising the steps of:

a) fabricating real diffusion structures according to a semiconductor design and fabricating a plurality of dummy diffusion structures in an unused region of the same semiconductor, each said real and dummy diffusion structures including a pad nitride layer remaining on top of said structures, and a conforming oxide deposition layer formed above said pad nitride layer and trench regions surrounding said structures;

b) constructing a planarization photoresist pattern over said trench regions on said oxide layer about said real and dummy diffusion structures and applying a resist material to said real and dummy diffusion structures, said pattern being designed such that an amount of resist retained above said real diffusion structures is at a first level and, an amount of resist retained above said plurality of dummy diffusion shapes is at a second level, said first level being greater than said second level; and, c) proceeding with standard STI processing including an oxide-etch step for removing said conformal oxide deposition not rendered in photoresist; and, d) during said oxide-etch step, detecting a nitride emission endpoint signal arising from the dummy diffusion structures, and terminating said oxide-etch step based on said nitride emission endpoint signal.

3. The method according to claim 2, wherein step b) of constructing said planarization photoresist pattern on said oxide layer about said real and dummy diffusion structures includes the step of providing an adjusted planarization pattern about said dummy diffusion shapes so as to prevent complete planarization of said dummy diffusion structures.

4. The method according to claim 3, wherein said step of providing an adjusted planarization pattern about said dummy diffusion shapes results in constructing an offset "h" representing a height difference between a surface topography of a region comprising said real diffusion structures and a surface topography of a region comprising said dummy diffusion structures, said height of said dummy diffusion structures being less than said real diffusion structures.

5. The method according to claim 4, wherein said height offset causes said pad nitride region to be exposed in said dummy diffusion structures during said oxide-etch step before pad nitride is exposed in said real diffusion structures.

6. The method according to claim 5, wherein said offset h is a function of the size of said adjusted planarization pattern about said dummy diffusion structures.

7. The method according to claim 6, wherein said planarization photoresist pattern includes a rectangular area formed over said trench region in said unused region.

8. The method according to claim 6, wherein said planarization photoresist pattern includes a polygonal area formed over said trench regions in said unused region.

9. The method according to claim 1, wherein said first uniform coating of photoresist applied to said first region is patterned so as to leave just enough photoresist material in and around said trenches such that a total volume of photoresist material in a small neighborhood in said first region is substantially equal to a total trench volume within the same neighborhood and, said photoresist in said second region is patterned so as to leave just enough photoresist material in and around said trenches such that a total volume of photoresist material in any small neighborhood in said second region is less than a total trench volume within the same neighborhood.

10. The method according to claim 1, wherein the thickness of said first coating of photoresist material being applied to said first and second regions is approximately equal to the depth of said trenches.

* * * * *